United States Patent
Okamoto et al.

(10) Patent No.: US 7,754,962 B2
(45) Date of Patent: Jul. 13, 2010

(54) METHOD FOR MANUFACTURING PHOTOVOLTAIC MODULE

(75) Inventors: Shingo Okamoto, Toyonaka (JP); Toshio Yagiura, Kobe (JP)

(73) Assignee: Sanyo Electric Co., Ltd., Moriguchi-shi, Osaka (JP)

( * ) Notice: Subject to any disclaimer, the term of this patent is extended or adjusted under 35 U.S.C. 154(b) by 979 days.

(21) Appl. No.: 11/453,226

(22) Filed: Jun. 15, 2006

(65) Prior Publication Data

US 2006/0283496 A1    Dec. 21, 2006

(30) Foreign Application Priority Data

Jun. 16, 2005  (JP)  ............... 2005-176718
Mar. 31, 2006  (JP)  ............... 2006-098248

(51) Int. Cl.
    *H01L 31/042* (2006.01)
(52) U.S. Cl. .................................... 136/244
(58) Field of Classification Search ......... 136/243–265; 228/121, 232
    See application file for complete search history.

(56) References Cited

U.S. PATENT DOCUMENTS

| 4,459,163 | A | * | 7/1984 | MacDiarmid et al. ....... 438/482 |
| 4,581,248 | A | * | 4/1986 | Roche ........................ 427/554 |
| 5,456,764 | A |   | 10/1995 | Asano et al. |
| 6,841,728 | B2 | * | 1/2005 | Jones et al. ................. 136/244 |
| 7,105,206 | B1 | * | 9/2006 | Beck et al. .................. 427/495 |

FOREIGN PATENT DOCUMENTS

| JP | 2003-168811 | 6/2003 |
| WO | WO2005/096396 | 10/2005 |

OTHER PUBLICATIONS

Taguchi et al., HIT (TM) Cells—High-efficiency crystalline Si cells with novel structure, Progress in photovoltaics, 2000, vol. 8, pp. 503-513, Nov. 2, 2000.*
Chinese Office Action issued Jan. 23, 2009 in CN200610110817.X.
Chinese Office Action dated Nov. 27, 2009 issued in Chinese Patent Application No. 200610110817X.

* cited by examiner

*Primary Examiner*—Kuang Y Lin
*Assistant Examiner*—Kevin E Yoon
(74) *Attorney, Agent, or Firm*—Edwards Angell Palmer & Dodge LLP

(57) ABSTRACT

This invention is made to improve the characteristics of a photovoltaic module in which a plurality of solar cells are electrically connected to each other with connecting members such as tabs or connecting leads. The present invention provides a method for manufacturing a photovoltaic module comprising a plurality solar cells each including a semiconductor heterojunction made by combining amorphous silicon and crystalline silicon and connecting members for connecting the plurality solar cells in which the connecting members are connected to the solar cells by soldering after a high-temperature heat treatment is applied to the solar cells, and the plurality of solar cells are electrically connected to each other with the connecting members.

22 Claims, 9 Drawing Sheets

2) flux application step  3) heat treatment step  4) tab instllation step  5) soldering step

METHOD FOR MANUFACTURING PHOTOVOLTAIC MODULE

This application claims priority in foreign applications Number JP2005-176718 and JP2006-098248.

BACKGROUND OF THE INVENTION

1. Field of the Invention

This invention relates to a method for manufacturing photovoltaic modules, in particular, relates to a method for manufacturing a photovoltaic module in which a plurality of solar cells are electrically connected to each other by connecting members referred to as connecting tabs, connecting leads, or the like.

2. Description of Related Art

With the recent growing expectation on clean energy to solve the global environment conservation issues such as the global warming, attention is being given to solar batteries, as a clean energy source, which directly convert sunlight into electric energy. Typical photovoltaic devices using these solar batteries for power generation include a plurality of solar cells and are configured to electrically connect the adjacent solar cells to each other in series or in parallel by soldering with connecting tabs, each made of a copper film, in order to obtain a desired output.

In Japanese unexamined patent publication No. 2003-168811, these connecting tabs are used as lead wires for connecting the plurality of solar cells in series or in parallel and are also used as output terminals.

A description will be made on a typical interconnection process in which the connecting tabs are connected to solar cells. Firstly, a plurality of solar cells each having bus bar electrodes provided on their surfaces for the tab connection are prepared (the first step). Next, the plurality of solar cells are applied with flux (the second step), subsequently a connecting tab is disposed from an upper surface of a solar cell to a lower surface of an adjacent solar cell by using solder (the third step). Then, the disposed connecting tab is pressed from above against the cell so that the connecting tab does not lift up, while being heated to solder the connecting tab (the fourth step).

The interconnecting processes currently in vogue fall into two broad categories based on the heating method for connecting the connecting tab: a lamp heating interconnection scheme; and a hot-air heating interconnection scheme.

In the lamp heating interconnection scheme, light from a light source that is a lamp such as a halogen lamp is focused and irradiated onto the connecting tab to be soldered. The light irradiation from the lamp with an output of approximately from 1500 W to 2500 W for a few seconds enables the soldering of the interconnector with the use of lead-free solder. This scheme has an advantage of a relatively quick temperature rise; however, exact heat control is difficult, therefore causing more cracks or warpage in the cells. On the other hand, in the hot-air heating interconnection scheme, hot air in a temperature range of 250 degrees Celsius (° C.) to 480 degrees Celsius but equal to the solder's melting temperature or higher is applied to the proximity of the connecting tab. The soldering of the interconnector with lead-free solder can be achieved by applying hot air having a temperature equal to the solder's melting temperature or higher for a few seconds. The hot-air heating interconnection scheme involves high accurate heat control, thereby preventing cracks and warpage in the cells and improving yields.

The photovoltaic module in which the connecting tabs are connected through the interconnecting process may have residual components of flux and organic substances used during the interconnecting process. In order to remove the residues without cleaning, International publication No. WO 2005/096396 A1 proposes a method for evaporating flux by heating the cells with the tabs connected thereto.

A solar cell includes several junctions between a surface collector electrode and a semiconductor layer and between a surface anti-reflection layer and an electrode layer and interface junctions between semiconductor layers. It is known that a cell's output is improved by enhancing the interface properties. Generally, hydrogen passivation or thermal annealing is often performed.

There has been a great deal of research and commercialization of solar batteries using crystalline semiconductors such as single-crystal silicon and polycrystalline silicon. Noteworthy among these is a solar cell having a semiconductor heterojunction formed by combining amorphous silicon and crystalline silicon since the junction can be formed through a low temperature process, 200 degrees Celsius or lower, such as a plasma CVD method, and such a solar cell having the junction can provide high conversion efficiency. In order to improve the photoelectric conversion efficiency of this type of solar cell, it is necessary to improve fill factor (F.F.), while maintaining high short-circuit current (Isc) and open-circuit voltage (Voc).

To this end, there developed a solar cell in which a substantially intrinsic amorphous silicon layer (i-type amorphous silicon layer) containing hydrogen is interposed between an n-type single-crystal silicon substrate and a p-type amorphous silicon layer containing hydrogen.

However, the solar cell having the amorphous silicon layer formed through the CVD method have the output characteristics deteriorate if heated for a long time at a temperature as high as 200 degrees Celsius or more.

The possible causes of the deterioration in the output characteristics by heating at high temperatures are: (1) diffusion of electrode materials into doped amorphous semiconductor thin films containing hydrogen; (2) diffusion of the dopant into substantially intrinsic amorphous semiconductor thin-film layers; (3) diffusion of hydrogen; and others. Among these, cause (3) affects the output characteristics the most at low temperatures.

It is known, as discussed above, that thermal annealing is effective in improving the output characteristics. However, the solar cell having the amorphous silicon layer formed through the CVD method may have the output characteristics deteriorate due to being heated for a long time at high temperatures. Because of this, a forming process of the electrodes, a laminating process and so forth that are performed after formation of the amorphous silicon layer are so controlled not to exceed the temperature adopted in the CVD process. However, further improvement is desired for the output characteristics of such formed solar cells.

Since the object of WO 2005/096396 A1 is to vaporize the flux residues, the solar cell is exposed to heat that is higher than the temperature for vaporizing flux after soldering. For this reason, there is no adequate consideration for the heat treatment for improving the output characteristics of the solar cells.

SUMMARY OF THE INVENTION

In view of the above problems, inventors of the present invention considered and investigated thoroughly the solar cell after the collector electrode is formed, and found that optimally controlled heating temperature and heating time would improve the output characteristics.

This invention was made based on the findings and has an object to improve characteristics of a photovoltaic module in which a plurality of solar cells are electrically connected to each other by connecting members referred to as connecting tabs or connecting leads.

The present invention offers a method for manufacturing a photovoltaic module with a plurality of solar cells electrically connected to each other by connecting members and is characterized in that a high-temperature heat treatment is applied to the solar cells before the connecting members are connected to the solar cells by soldering.

The high-temperature heat treatment herein is performed at temperatures capable of improving the outputs of the solar cells and is preferably applied to the entirety of the solar cells.

More preferably, the high-temperature heat treatment may be applied approximate uniformly to the entirety of the solar cells after the collector electrode is formed.

Preferably, this invention is configured so that solder is melted by application of hot air to perform the soldering.

The present invention is characterized by manufacturing a photovoltaic module comprising solar cells each having a semiconductor heterojunction formed by combining amorphous silicon and crystalline silicon and connecting members for connecting the plurality of solar cells, and characterized in that the connecting member are connected to the solar cell by soldering after high-temperature heat treatment is applied to the solar cell so that the plurality of solar cells are electrically connected to each other by the connecting tab.

The high-temperature heat treatment may be applied to the solar cells after the collector electrode is formed.

Preferably, this invention is configured so that solder is melted by application of hot air to perform the soldering.

The high-temperature heat treatment is characterized by including at least light irradiation by a light irradiation device. Preferably the light is irradiated all over the upper surface of the solar cell. More preferably, the light is approximate uniformly irradiated all over the upper surface of the solar cell. A lamp device is preferable as the light irradiation device.

The high-temperature heat treatment may include the application of heat by a heater and the light irradiation by the light irradiation device, both are performed simultaneously. In this case, the temperature of the heater may be maintained at 290 degrees Celsius or higher but lower than 350 degrees Celsius, while the light irradiation by the light irradiation device may be performed for from 2 seconds to 20 seconds.

The high-temperature heat treatment may be configured so that the light irradiation by the light irradiation device is performed in order to improve the output of the solar cell, while the temperature of the heater is maintained at from 200 degrees Celsius to 350 degrees Celsius.

The solar cell is characterized by comprising transparent electrodes which are ITO films formed by a low-temperature sputtering method.

The high-temperature heat treatment may be performed with the application of heat by the heater and light irradiation by a halogen lamp device. The preferable total output of the halogen lamp device is 1000 W or lower.

While the temperature of the heater is maintained at 200 degrees Celsius or higher but lower than 300 degrees Celsius, the light irradiation by the halogen lamp device is performed for from 2 seconds to 20 seconds.

The high-temperature heat treatment may be performed with the application of heat by the heater and light irradiation by an infrared lamp device. While the temperature of the heater is maintained at 190 degrees Celsius or higher but lower than 290 degrees Celsius, the light irradiation by an infrared light irradiation device is performed for 3 seconds or shorter. Additionally, the infrared light irradiation device may have an irradiation intensity of raising the temperature of the solar cell above the set temperature of the heater.

It is assumed that the above discussed configuration of this invention can improve the interface properties of the solar cell, therefore improving the output thereof, and also make an interconnection under accurate temperature control. Consequently, the present invention can provide a method for manufacturing the photovoltaic module with good solar cell characteristics and high yield.

The foregoing and other objects, features, aspects and advantages of the present invention will become more apparent from the following detailed description of the present invention when reviewed in conjunction with the accompanying drawings.

DETAILED DESCRIPTION OF THE PREFERRED EMBODIMENTS

With reference to the drawings, detailed descriptions will be made on an embodiment of the present invention. Components identical or equivalent to each other in the drawings are denoted the same reference number, and will not be further explained to avoid repetition.

Figure 1:
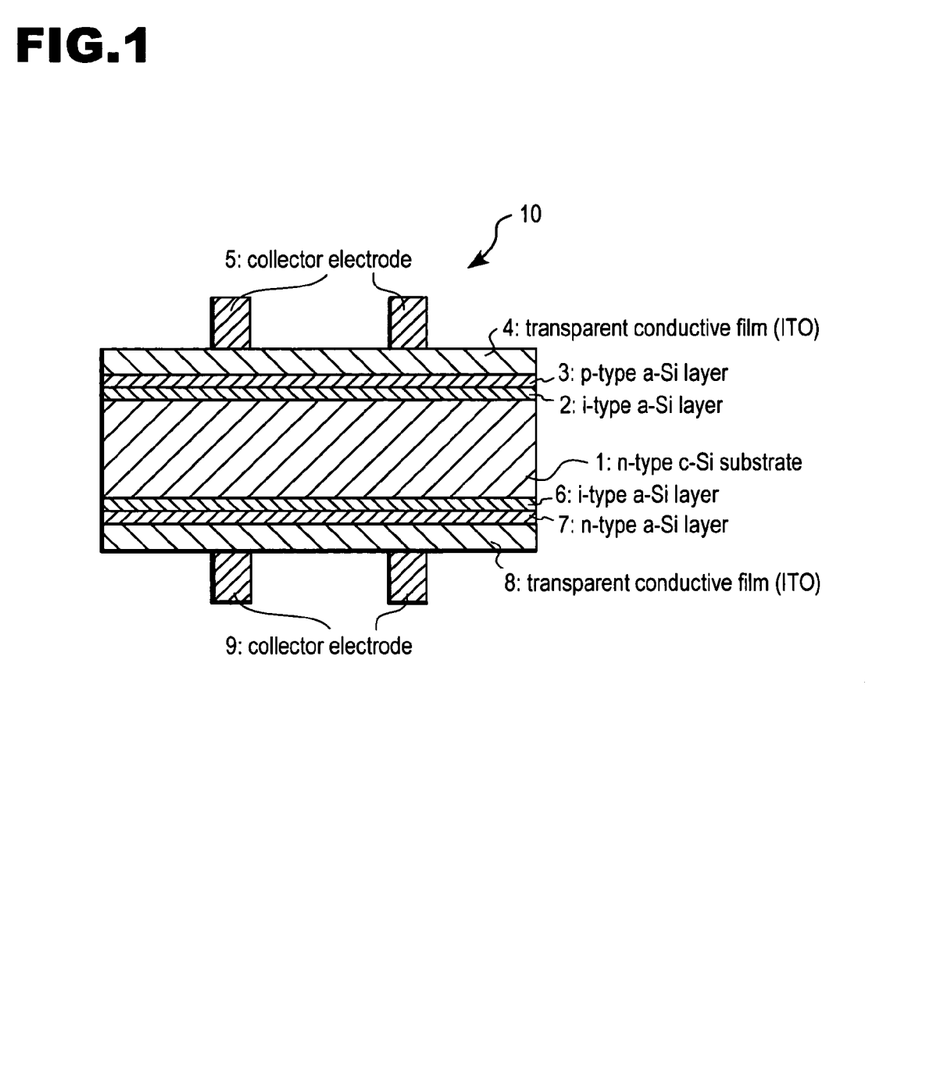
FIG. 1 is a schematic cross-sectional view illustrating one example of a solar cell to which the present invention is applied.

Firstly, an example of the solar cell to which this invention is applied will be described by referring to FIG. 1. The solar cell 10, as shown in FIG. 1, includes an n-type single-crystal silicon substrate 1 having a thickness of 100 μm to 300 μm and (100) planes (hereinafter referred to as "n-type single-crystal silicon substrate 1) as a crystalline semiconductor substrate. On the surface of the n-type single-crystal silicon substrate 1, there formed pyramidal projections and depressions having a height of a few micro meters to a few tens of micro meters for confining light. A substantially intrinsic i-type amorphous silicon (a-Si:H) layer 2 having a thickness of a few nanometers to a few tens of nanometers is formed on the n-type single-crystal silicon substrate 1 by a CVD method as a substantially intrinsic amorphous semiconductor thin film containing hydrogen. On the i-type amorphous silicon layer 2, there formed a p-type amorphous silicon layer 3 having a thickness of a few nanometers to a few tens of nanometers as a doped amorphous semiconductor thin film layer containing hydrogen.

An ITO film (Indium Tin Oxide) 4 is formed on the p-type amorphous silicon layer 3 by a sputtering method as a transparent conductive oxide film.

Comb-shaped collector electrode 5 made by burning silver (Ag) paste is provided at predetermined regions on the upper surface of the ITO film 4. The collector electrode 5 is formed as follows: printing the Ag paste to form finger portions and a bus bar portion by a screen printing method; and burning (and curing) them. The plurality of finger portions are formed in parallel with each other, while the bus bar portions collect electric current flowing in the finger portions. A connecting tab is soldered to a bus bar portion to make an electric connection between solar cells.

On the lower surface of the n-type single-crystal silicon substrate 1, there formed a substantially intrinsic i-type amorphous silicon layer 6. An n-type amorphous silicon layer 7 is formed on the i-type amorphous silicon layer 6. By forming the i-type amorphous silicon layer 6 and n-type amorphous silicon layer 7 on the lower surface of the n-type single-crystal silicon substrate 1 in this order accordingly, the so-called BSF (Back Surface Field) structure is formed. Further, an ITO film 8 is formed by sputtering on the n-type amorphous silicon layer 7 as a transparent conductive oxide film. Comb-shaped collector electrode 9 made by burning (and curing) the silver paste is provided at predetermined regions on the lower surface of the ITO film 8.

Figure 2:
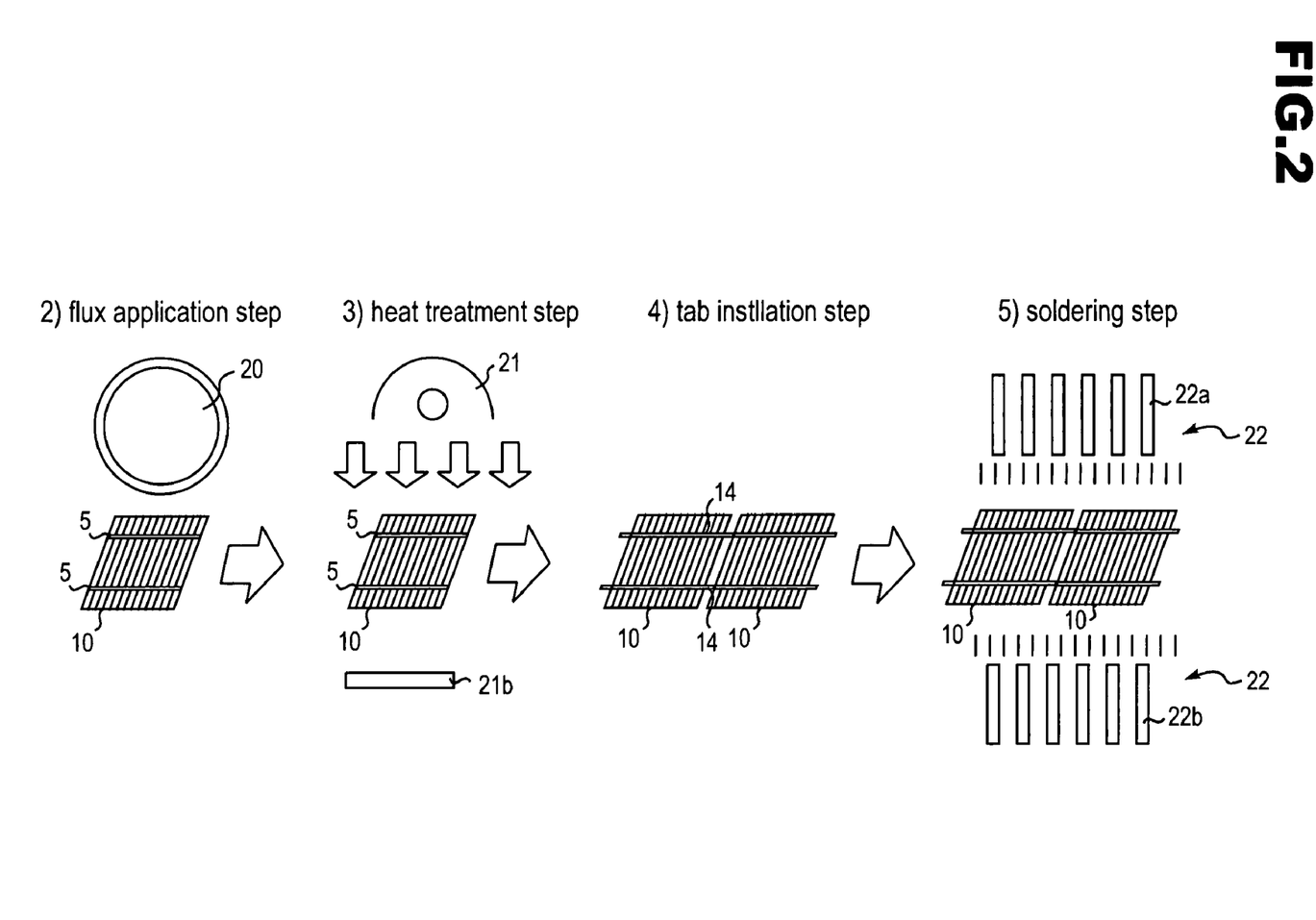
FIG. 2 illustrates a manufacturing process of a photovoltaic module according to an embodiment of the present invention.

FIG. 2 illustrates a manufacturing process of a photovoltaic module according to an embodiment of the present invention.

The solar cell 10 having the structure shown in FIG. 1 is mounted on a pallet (not shown) (the first step). A flux applicator 20 applies liquid flux to the bus bar portions of the collector electrode 5 of the solar cell 10 (the second step).

Subsequently, the entire solar cell 10 is heated at a predetermined temperature for a predetermined period of time to improve the interface properties (the third step). In this embodiment, a hot plate 21b heats the entire solar cell 10 from below the lower surface thereof, while a halogen lamp device 21 irradiates light on all over the solar cell from above the upper surface thereof, thereby the solar cell is heated to high temperature in a short time. The short-time high-temperature heat treatment can improve characteristics of the solar cell 10 without damage. Detailed descriptions on the temperature and time in the heating step will be made later. In addition to the combination use of the hot plate and lamp, the heating method may involve single use of the hot plate or light irradiation by the lamp. As discussed above, the high-temperature heat treatment is performed at temperatures capable of improving the output of the solar cell.

Next, two lines of a connecting tab 14 are disposed in parallel with each other across the adjacent solar cells 10 (the fourth step). The connecting tab 14 is made of a copper film coated with solder, in this embodiment, lead-free solder on the front and back surfaces of the copper film.

In order to prevent the disposed connecting tab 14 from lifting up, two lines of pressing pins 24 (see FIG. 3) of a pressing device, each having the approximately same width as that of the connecting tab 14, heat resistance and no solderability, then press the connecting tabs 14 against the solar cells 10. Hot air, which is equal to or higher than the melting temperature of the solder but in a range between 250 degrees Celsius and 480 degrees Celsius in this embodiment, is applied from hot-air outlets 22a, 22b of hot-air heaters 22 to the vicinity of the connecting tabs 14 to solder the interconnectors. In the case of lead-free solder, the interconnector is soldered by applying the hot air being as same as the melting temperature (217 degrees Celsius in this embodiment) or higher for a few seconds (the fifth step). Note that the pressing tool (not shown) is configured so as to press the connecting tabs 14 during soldering and to move away from the solar cell 10 after the completion of soldering.

Figure 3:
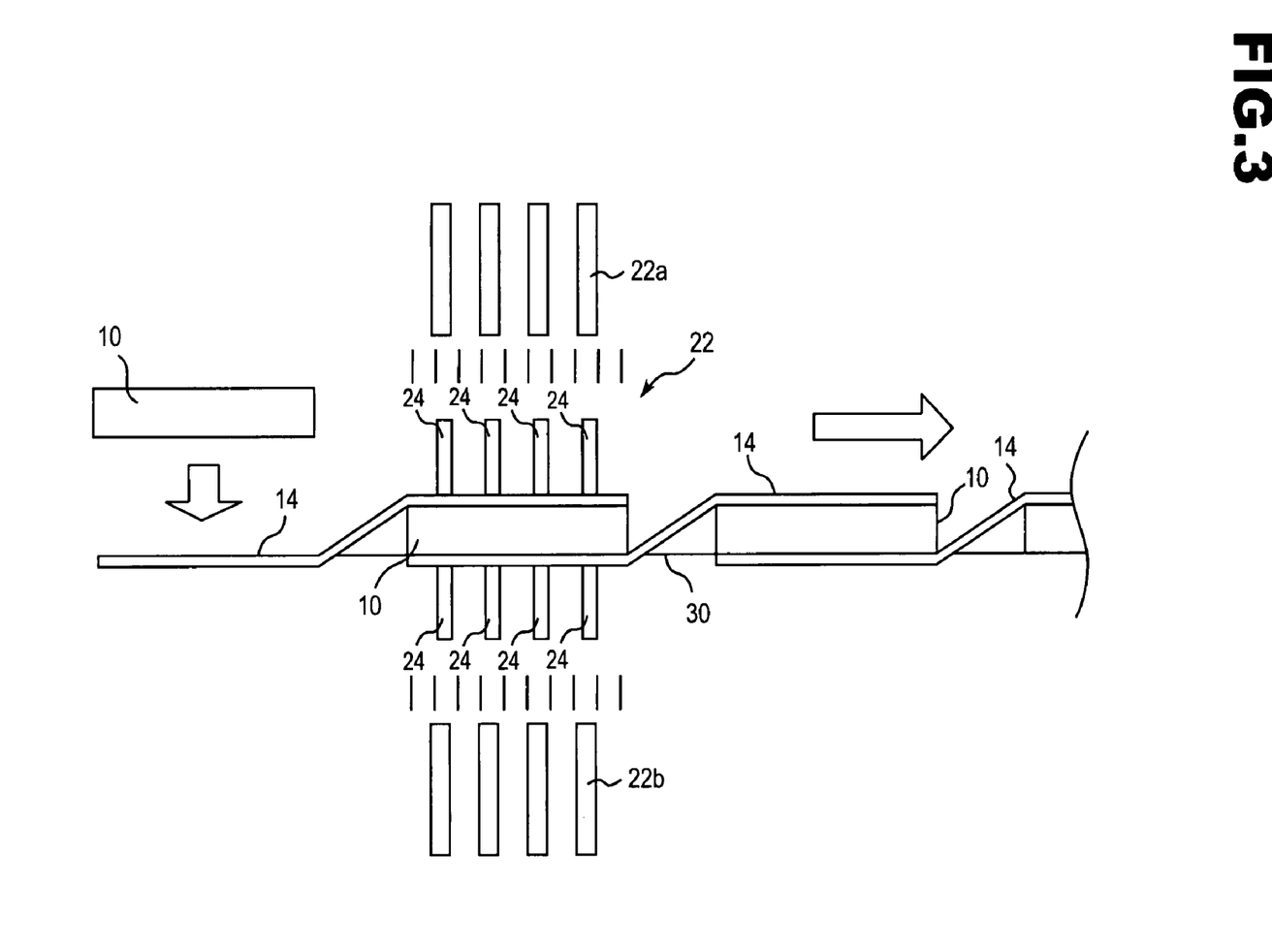
FIG. 3 is a schematic cross-sectional view illustrating a connecting tab installation step and soldering step in the manufacturing process of the photovoltaic module according to the embodiment of the present invention.

A description on an installation step and soldering step of the connecting tab will be made by referring to FIG. 3. The solar cell 10 is transferred by a transfer belt 30, which is an endless belt. The transfer belt 30 performs a periodic operation in which the belt makes a stop for a predetermined time and then runs for a predetermined time to carry the solar cell 10 from left to right in FIG. 3. A pressing device for pressing the connecting tabs 14 against the cell includes two lines of pressing pins 24, 24 which are located above and below the predetermined position where the connecting tabs 14 are soldered on the transfer belt 30 and moved up and down by a drive means (not shown). These pressing pins 24 are composed of materials having heat resistance but no solderability and disposed perpendicularly opposite to both of the upper and lower lines of the connecting tabs.

Hot-air heaters 22, functioning as hot-air type heating means are provided at positions perpendicularly opposite to both of the upper and lower lines of the connecting tabs 14, 14 like the pressing device. Each hot-air heater 22 includes, for example, an electric heater which generates heat upon energization and a fan and is configured so that air (hot air) heated by the electric heater is blown out by the fan through hot-air outlets 22a, 22b intensively onto the connecting tabs 14, 14.

The transfer belt 30 stops running with the two lines of the connecting tabs 14, 14 abutting the upper and lower surfaces of the cells 10 to be disposed; during the stop period, each of the pins 24, 24 of the pressing device descends (or ascends) to press the connecting tabs 14 against the upper surface and lower surface of the cell 10 so as to prevent the connecting tabs 14 from lifting up. However, if the connecting tabs 14 can be soldered to the cell 10 without the press, the pressing device is not always necessary.

In the state where the cells 10 have the connecting tabs 14 being pressed thereon, the electric heater and fan of the hot-air heaters 22 are energized to inject hot air of a high temperature onto the connecting tabs 14, 14 intensively so that the solder applied to the connecting tabs 14, 14 is heated at the temperature equal to or higher than the melting temperature of the solder.

The intensively injected hot air from the hot-air heaters 22 to the connecting tabs 14, 14 prevents the cells from damage caused by an extraordinary rise in temperature, because the other parts of the cell 10 are not excessively heated.

After the hot air is thus blown from the hot-air heaters 22 to the connecting tabs 14 pressed against the cells 10 for a predetermined time, the hot-air heaters are suspended.

Figure 4:
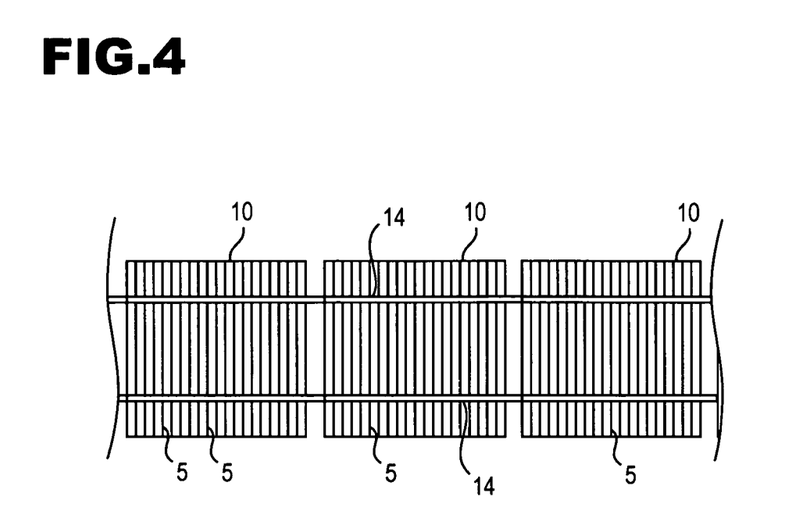
FIG. 4 is a plan view illustrating connecting tab strings of the photovoltaic module according to the embodiment of the present invention.

During the stop time, another cell 10 is mounted on the upper surface of the rear part of the connecting tab 14. The pins 24 then move away from the cells on the front part of the connecting tab 14. The transfer belt 30 then runs for a predetermined distance so as to move the newly mounted cell 10 to the soldering position, and a connecting tab 14 is placed on the upper surface of the new cell 10. Thus, as shown in FIG. 4, a plurality of cells 10 are connected in series with the connecting tabs 14, thereby a string is manufactured.

Figure 5:
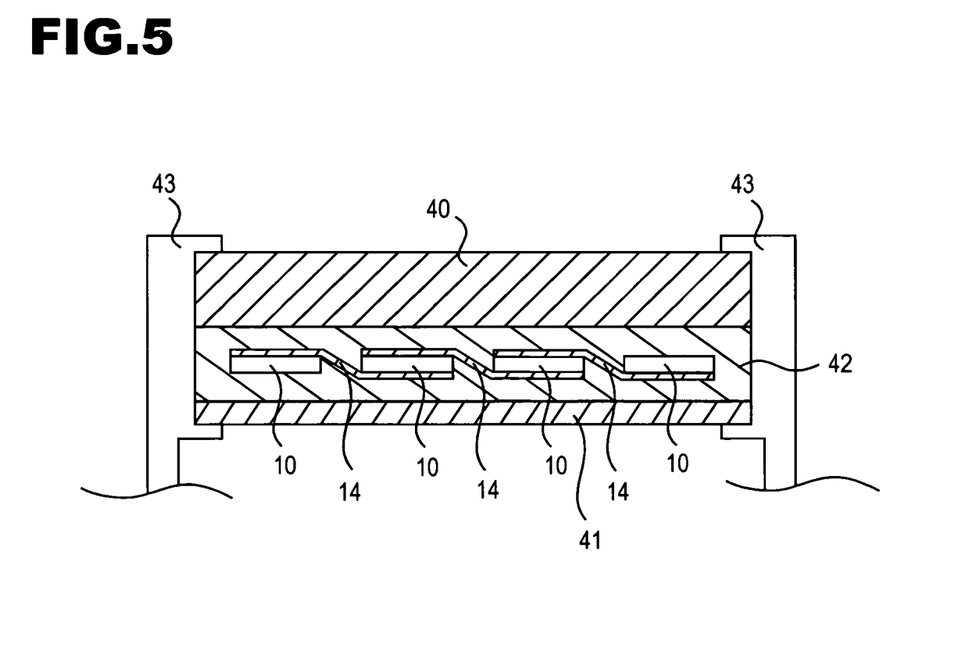
FIG. 5 is a schematic cross-sectional view of the photovoltaic module according to the embodiment of the present invention.

The plurality of solar cells 10 connected to each other with the connecting tabs 14 are sealed with a filler 42 between a front surface protective member 40 composed of, for example, white tempered glass and a back surface protective member 41 to obtain a photovoltaic module as illustrated in FIG. 5. The photovoltaic module includes the back surface protective member 41 having a three-layer structure PVF (poly vinyl fluoride)/Al (aluminum)/PVF (poly vinyl fluoride), the front surface protective member 40 composed of the white tempered glass and the sealing resin 42 composed of EVA (ethylene-vinyl acetate). These front and back surface protective members 40, 41 and sealing resin 42 are integrated at a temperature of, for example, 150 degrees Celsius by a vacuum thermo-compression bonding laminator and heated at 150 degrees Celsius for 30 minutes or longer in an oven to cross-link the EVA. Subsequently, an aluminum frame functioning as a protective frame 43 is attached with an adhesive such as butyl to complete the photovoltaic module.

Next description will be about the heat treatment performed prior to the above-discussed connection of the connecting tab. This heat treatment involving high temperatures and a brief treatment time provides good interface properties between layers due to annealing effect without damage to the solar cell, aiming at improvement of the solar cell characteristics.

In order to verify the efficacy of the heat treatment performed prior to the connection of the connecting tabs, a plurality of samples were prepared to measure changes in heating temperature and solar cell characteristics when heated by a heater for 10 seconds. The heating means employed in this measurement was a heater which does not irradiate light. In this embodiment the heater was a hot plate 21b.

Figure 6:
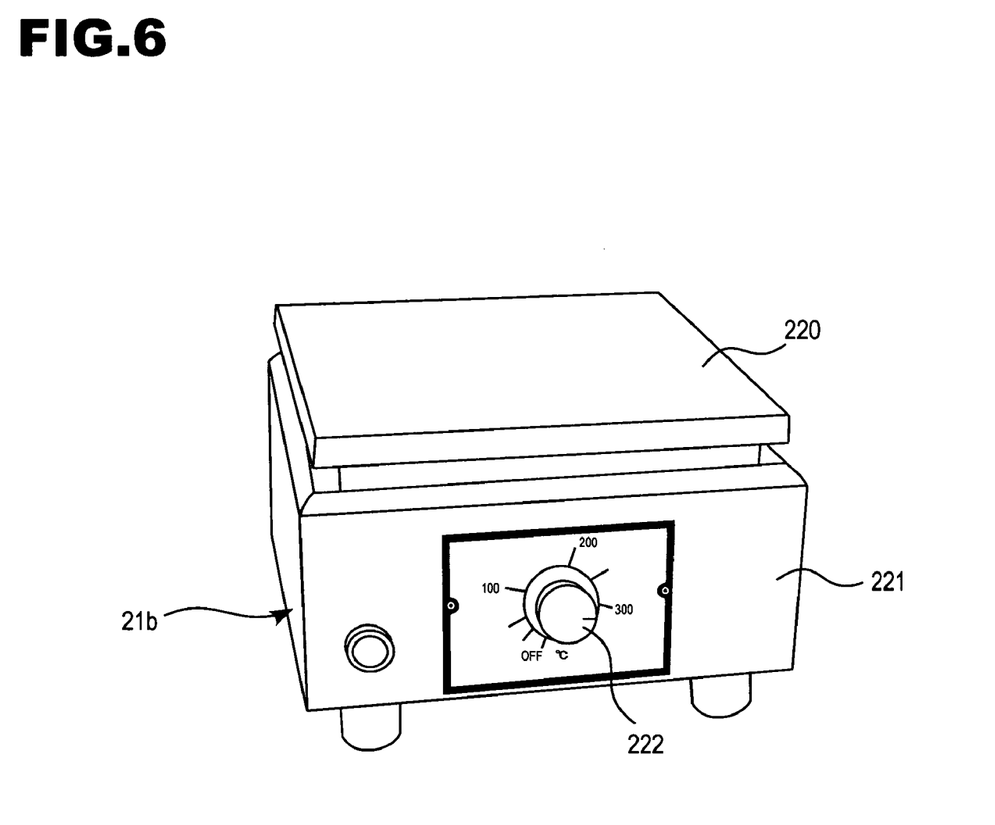
FIG. 6 is a typical perspective view of a hot plate used in the embodiment of the present invention.

FIG. 6 is a typical perspective view illustrating a hot plate used in the embodiment. This hot plate 21b is model HPA 1914B from Barnstead International. A plate 220 of the hot plate 21b is made of aluminum and measures 157 mm by 157 mm. The specification of the hot plate 21b shows: 100 V; 7.5 A; and 750 W. A control dial 222 for setting temperature is provided on a front surface of a main body 221 of the hot plate 21b. The operation of the control dial 222 sets the hot plate 21b to a predetermined temperature to perform the heat treatment. To set the temperature to 200 degrees Celsius, for example, the control dial 222 is rotated to the marking of 200 degrees Celsius. An internal heater is controlled so that the plate 220 has a surface temperature of 200 degrees Celsius.

With the use of the hot plate 21b shown in FIG. 6, the changes in the solar cell characteristics were measured. The solar cell characteristics of solar cells heated by the hot plate 21b are standardized by solar cell characteristics of solar cells not having undergone the heat treatment. In addition, solar cell characteristics of solar cells heated by the heater and lamp were measured and standardized in the same manner.

Figure 7:
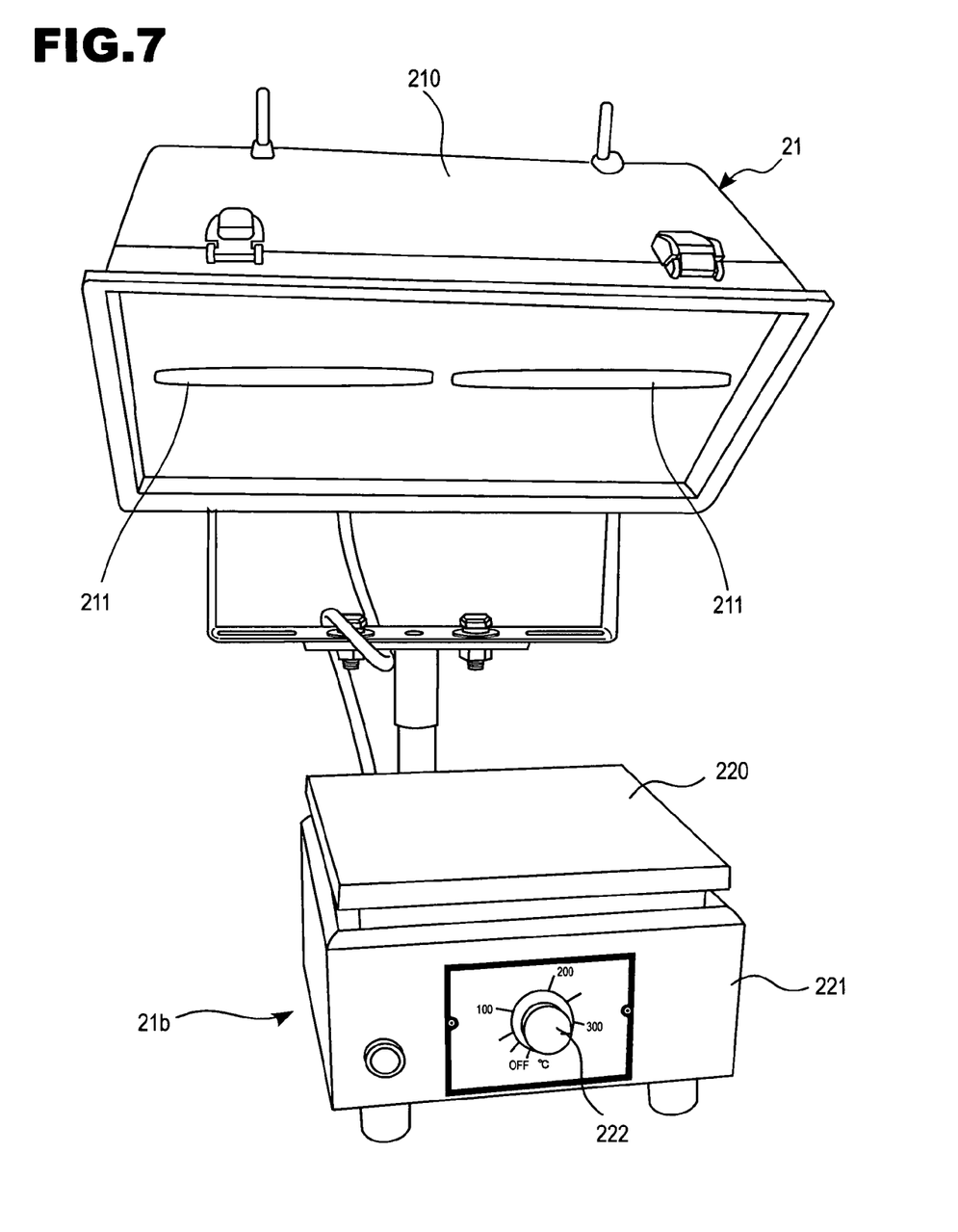
FIG. 7 is a typical perspective view of a heating apparatus of the hot plate and a lamp used in the embodiment of the present invention.

FIG. 7 is a typical perspective view of an apparatus performing the application of heat by a heater and light irradiation by a lamp. For the heater, the hot plate 21b shown in FIG. 6 is used. A halogen lamp device 21 including halogen lamps is mounted above the hot plate 21b so as to irradiate light uniformly on the entire plate 220. The distance between the lamp of the halogen lamp device 21 and the plate 220 of the hot plate 21b is maintained approximately 20 cm.

The halogen lamp device 21 used in the embodiment is a halogen light of model HST-1000D from Nichido Kogyo Kabushiki Kaisha. The halogen lamp device 21 is provided with two halogen light bulbs 211 within the reflector 210 and specified as 100V and 1000 W.

The solar cells 10 used in the measurement will be specifically described. The description below will be about specific thicknesses of layers and manufacturing conditions of the measured solar cells 10 whose structures are illustrated in FIG. 1.

The solar cell 10 includes an n-type single-crystal silicon substrate 1, as a crystalline semiconductor substrate, having resistivity of approximately 1 Ω/cm, a thickness of approximately 300 μm and (100) planes. On the front surface of the n-type single-crystal silicon substrate 1 there formed pyramidal projections and depressions having a height of a few micro meters to a few tens of micro meters by isotropic etching. The projections and depressions are made for confining light.

An i-type amorphous silicon (a-Si:H) layer 2 and a p-type amorphous silicon layer 3 each having a thickness of approximately 5 nm are deposited on the n-type single-crystal silicon substrate 1 to make a junction, by RF plasma CVD (13.56 MHz), at a formation temperature of 200 degrees Celsius, reaction pressure of 20 Pa, and RF power of 150 W. A compound gas containing B (boron) in group III elements is used as a p-type dopant.

An i-type amorphous silicon layer 6 and an n-type amorphous silicon layer 7 each having a thickness of approximately 5 nm are deposited on the back surface of the n-type single-crystal silicon substrate 1 in the same manner. A compound gas containing P (phosphorus) in group V elements is used as an n-type dopant.

Formation conditions of each amorphous silicon layer are shown in Table 1.

TABLE 1

| | | formation conditions, etc. | | |
| --- | --- | --- | --- | --- |
| | treatment | applied gas | pressure (Pa) | Power (W) |
| front | i-type a-Si | $H_2$: 100 sccm<br>$SiH_4$: 40 sccm | 20 | 150 |
| | p-type a-Si | $H_2$: 40 sccm<br>$SiH_4$: 40 sccm<br>$B_2H_6$ (2%): 20 sccm | 20 | 150 |
| back | i-type a-Si | $H_2$: 100 sccm<br>$SiH_4$: 40 sccm | 20 | 150 |
| | n-type a-Si | $H_2$: 40 sccm<br>$SiH_4$: 40 sccm<br>$PH_3$ (1%): 40 sccm | 20 | 150 |

On the amorphous silicon layers 3 and 6, which were thus formed on the front and back surfaces of the n-type single-crystal silicon substrate 1 respectively, ITO films (Indium Tin Oxide layers) 4 and 8 each having a thickness of 100 nm are formed by sputtering. In these samples, the ITO films 4 and 8 are made of indium oxide doped with tin (Sn). Firstly, a sintered body containing $In_2O_3$ powder with 5 wt % of $SnO_2$ powder was placed on a cathode electrode as a target. A chamber, in a DC sputtering system, where the element was placed was then evacuated. The solar cell element is heated by a heater to raise its substrate temperature from the room temperature to 200 degrees Celsius. Then, a compound gas of argon (Ar) and oxygen ($O_2$) is introduced as maintaining pressure at 0.4 Pa to 1.3 Pa, and DC power of 0.5 kW to 2 kW is applied to the cathode, consequently forming the above-mentioned ITO films 4 and 8 each having a thickness of 100 nm.

At predetermined areas on the upper surface of the ITO film 4 and the lower surface of the ITO film 8, silver paste made of epoxy resin or the like with silver (Ag) fine powder kneaded is printed by screen printing so as to have a height between 10 μm and 30 μm and a width between 100 μm and 500 μm, and then sintered (and cured) at 200 degrees Celsius for 80 minutes, and consequently forming finger portions and bus bar portions.

Such formed samples, five per a condition, were prepared. The heating temperature ranges from 190 degrees Celsius to 350 degrees Celsius. The halogen lamp in use outputs approximately 1000 W, which is lower than halogen lamps usually used for soldering. The lamp irradiation time was 10 seconds.

The reason why the halogen lamp device 21 of 1000 W was used will be described as follows. As will be described later, for example the use of the halogen lamp device 21 of 1000 W hardly causes the solar cell to rise in temperature in the course of heating at 290 degrees Celsius on the hot plate 21b. Therefore, the 1000 W halogen lamp device 21 might be advantageous to control temperature for a few seconds. If the halogen lamp device 21 outputs more intensive light than that of 1000 W, the temperature of the solar cell increase with the lamp irradiation, more likely causing deterioration of the solar cell characteristics. Therefore, it is difficult to control condition of the solar cell. On the other hand, in the case where one of the halogen lamp bulbs is turned off, the 500 W halogen lamp device 21 is not strong enough to uniformly irradiate light over the entire solar cell, and therefore decreases the effect. For these reasons, the 1000 W halogen lamp device 21 was used in this embodiment.

However, if there is a halogen lamp device capable of uniformly irradiating light over the entire solar cell, the device is acceptable even if its light intensity is less than that of 1000 W.

The temperature of the solar cell in the course of heating by the lamp irradiation is measured by the following methods. First of all, the temperature of the hot plate 21b is set to 290 degrees Celsius, and the solar cell is then placed on the hot plate 21b holding a steady temperature. Then the temperature measurement is made by the next two methods.

(1) a thermocouple is placed on a surface of the solar cell. (2) a thermocrayon higher. On the other hand, the characteristics of the cells heated at excessively high temperatures tend to decrease. Consequently, it is preferred that the ten-second heat treatment by a hot plate alone should be performed at 350 degrees Celsius or lower.

In addition, the cells heated by the heater with the simultaneous lamp irradiation show a more excellent effect than the cells heated without the lamp irradiation in all temperature ranges. It is clear from the results that the combined use of the heater and lamp is preferred.

Figure 9:
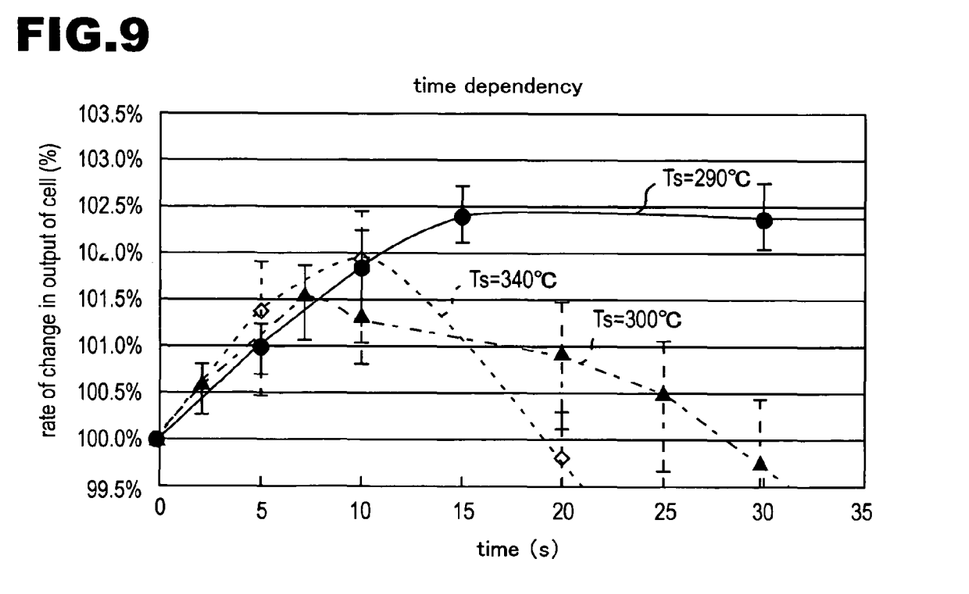
FIG. 9 illustrates the relationship between irradiation time and changes in the solar cell characteristics when the cells are heated by a hot plate at from 290 degrees Celsius to 340 degrees Celsius and further irradiated with light by a halogen lamp.

Next, in order to verify the effect of the combined use of the heater and lamp, the relationship between the time length of the light irradiation by the halogen lamp and changes of the solar cell characteristic was measured with temperatures by the hot plate of 290 degrees Celsius, 300 degrees Celsius, and 340 degrees Celsius. Table 3 and FIG. 9 show maximum values, minimum values and average values of measurement results of five samples under each condition. The temperature of the heater was so controlled not to rise beyond an upper limit which was the measurement temperature set in each condition. Because of this, each sample was applied somewhat lower heat than the measurement temperature; however it is still within the acceptable range.

TABLE 3

| heating time (sec) | 290 degrees Celsius | | | 300 degrees Celsius | | | 340 degrees Celsius | | |
| --- | --- | --- | --- | --- | --- | --- | --- | --- | --- |
| | max. | min. | ave. | max. | min. | ave. | max. | min. | ave. |
| 0 | 100.1 | 99.9 | 100 | 100.1 | 99.9 | 100 | 100.2 | 99.9 | 100 |
| 2 | — | — | — | 100.8 | 100.4 | 100.65 | — | — | — |
| 5 | 101.3 | 100.7 | 101 | — | — | — | 101.9 | 100.5 | 101.4 |
| 7 | — | — | — | 101.9 | 101.1 | 101.55 | — | — | — |
| 10 | 102.3 | 101.5 | 101.85 | 101.8 | 100.8 | 101.4 | 102.5 | 101.1 | 101.95 |
| 15 | 102.8 | 102.2 | 102.4 | — | — | — | — | — | — |
| 20 | — | — | — | 101.5 | 100.2 | 101 | 100.4 | 99.4 | 99.85 |
| 25 | — | — | — | 101.1 | 99.7 | 100.6 | — | — | — |
| 30 | 102.8 | 102.1 | 102.4 | 100.5 | 98 | 99.8 | — | — | — |

The values shown in Table 3 and FIG. 9 are obtained by standardizing solar cell characteristics of the solar cells simultaneously heated by hot plate and halogen lamp by characteristics of the solar cells not having undergone the high-temperature heat treatment. The halogen lamp in use outputs approximately 1000 W, which is lower than halogen lamps usually used for soldering.

As shown in Table 3 and FIG. 9, it is apparent that the light irradiation by the lamp improves the characteristics. It is found that the characteristic changes of the cells heated at 290 degrees Celsius by the heater are saturated when light irradiation time exceeds 15 seconds. On the contrary, the cells heated at over 300 degrees Celsius have their characteristics deteriorate with a certain length of the irradiation time elapsed.

As appreciated from Table 3 and FIG. 9, the cells heated by the combined use of the lamp and heater of 290 degrees Celsius have a peak effect just after the 15-second lamp irradiation but do not show any more effect changes since then. It is clear from the result that in the case of the heating temperature of 290 degrees Celsius, a preferable irradiation time is 5 seconds or longer, but 20-seconds or shorter irradiation is enough under consideration of throughput.

The cells heated at 300 degrees Celsius or higher have the peak effect before 15 seconds, especially the cells heated at 300 degrees Celsius to 340 degrees Celsius have the peak effect before 10 seconds. Although longer irradiation than these time lengths deteriorates the solar cell characteristics because of thermal damage, the light irradiation by the lamp effectively causes the higher output of the cells than those heated by the heater alone.

In the case of the heating temperature of 300 degrees Celsius by the heater, the preferable light-irradiation time by the lamp is from 2 seconds to 25 seconds.

In the case of the heating temperature of 340 degrees Celsius by the heater, the preferable light-irradiation time by the lamp is from 2 seconds or longer but shorter than 20 seconds, and more preferably from 5 seconds to 10 seconds. Therefore, the cells heated by the heater at 300 degrees Celsius or higher but lower than 350 degrees Celsius require the light irradiation for 2 seconds or longer but shorter than 20 seconds, preferably for 5 seconds or longer but shorter than 15 seconds, and more preferably from 5 seconds to 10 seconds.

Figure 8:
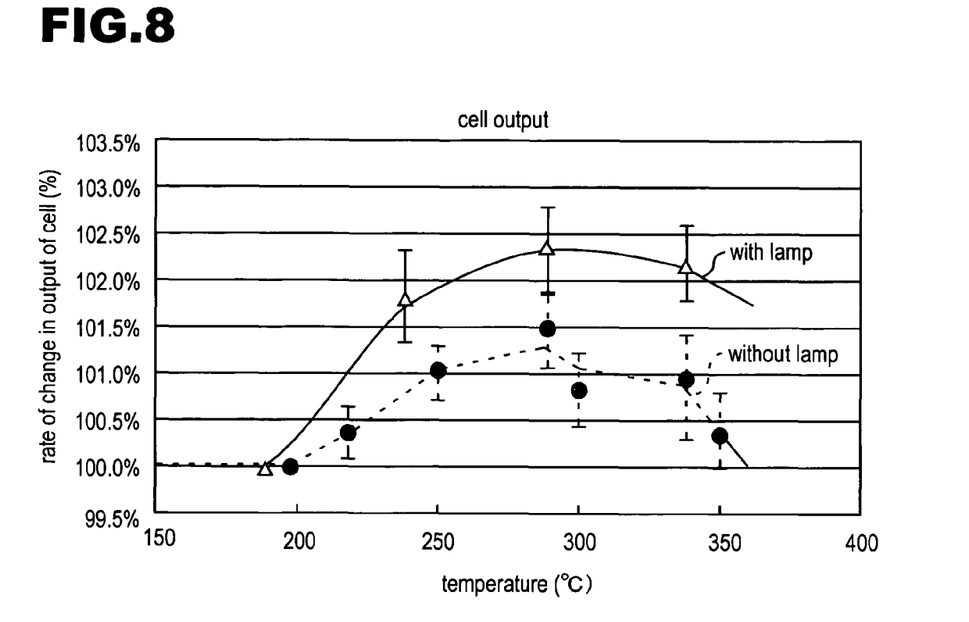
FIG. 8 illustrates the relationship between heating temperatures and changes in the solar cell characteristics when the cells are heated for 10 seconds by a heater.

The comparison between FIG. 8 and FIG. 9 shows that the combination use of the hot plate (heater) and lamp irradiation provides more effective results than the single use of the hot plate (heater) when all cells are heated for ten seconds. This is believed that a light-irradiation effect created by adding the lamp irradiation to the heater contributes to the characteristics improvement. Even if the cells are subjected to high heat of 200 degrees Celsius or higher by lamp irradiation alone with an omission of the hot plate (heater) heating, it is assumed that the characteristics could be improved more than those of cells heated by the hot plate (heater) alone.

Figure 10:
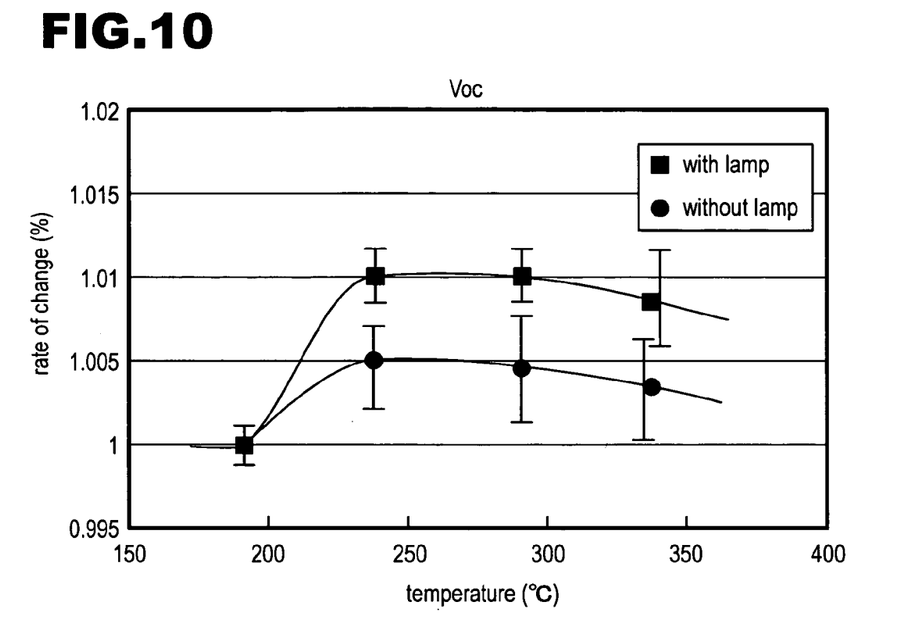
FIG. 10 illustrates the relationship between heating temperatures and changes in open voltage when the cells are heated by the hot plate at from 290 degrees Celsius to 340 degrees Celsius and further irradiated with light by the halogen lamp.
Figure 11:
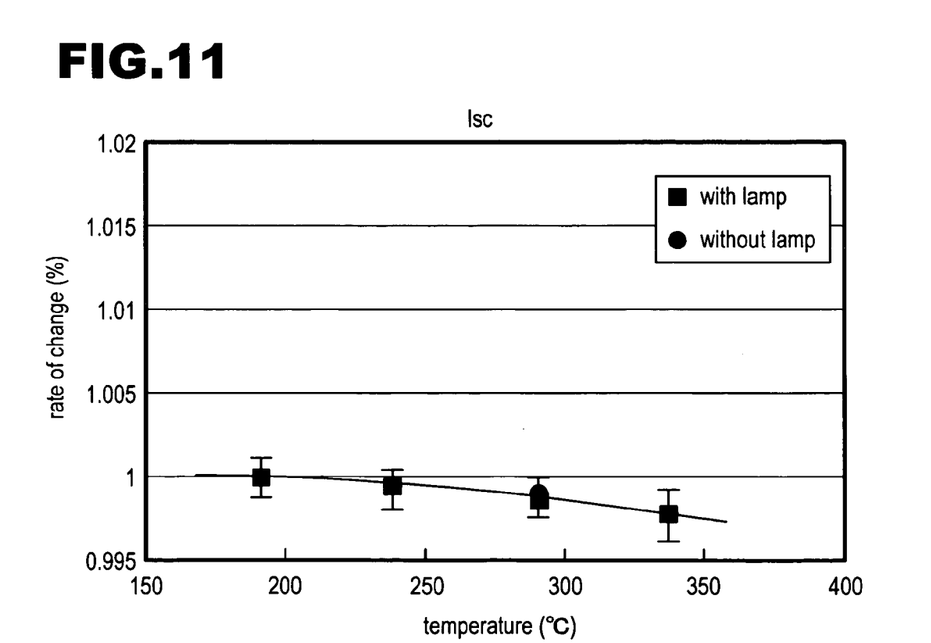
FIG. 11 illustrates the relationship between heating temperatures and changes in short-circuit current when the cells are heated by the hot plate at from 290 degrees Celsius to 340 degrees Celsius and further irradiated with light by the halogen lamp.
Figure 12:
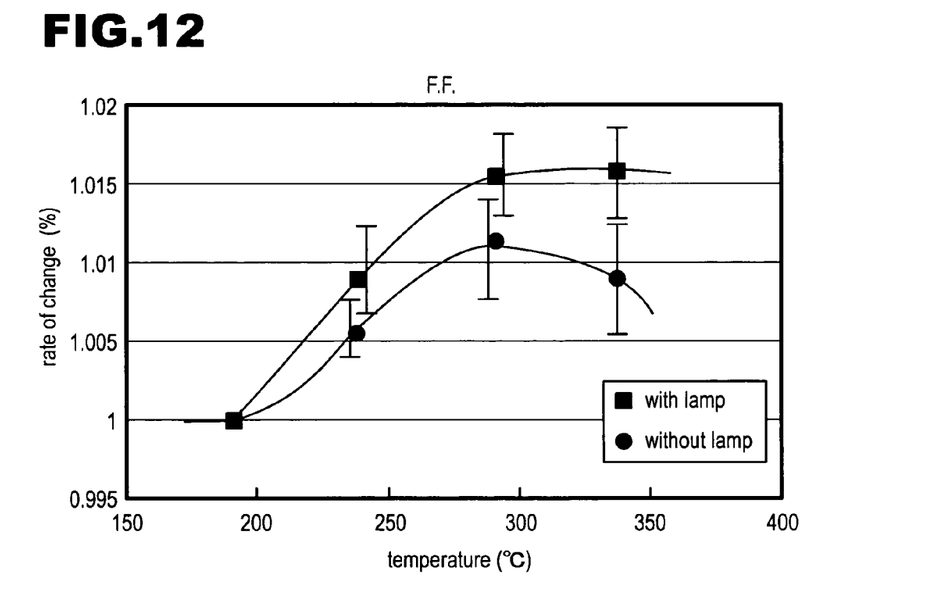
FIG. 12 illustrates the relationship between heating temperatures and changes in fill factor (F.F.) when the cells are heated by the hot plate at from 290 degrees Celsius to 340 degrees Celsius and further irradiated with light by the halogen lamp.

Next description will be on FIGS. 10 to 12. Five samples per a condition were prepared. FIGS. 10 to 12 show heating temperatures of the heater and parameter properties of the solar cells heated by the heater alone for 10 seconds and parameter properties of the solar cells heated by the heater and lamp for 10 seconds, each parameter properties are standardized by the parameter properties of solar cells not having undergone the high-temperature heat treatment. The apparatus shown in 7 was used for this measurement. The heating temperature of the heater ranges from 190 degrees Celsius to 340 degrees Celsius. The halogen lamp in use outputs approximately 1000 W, which is lower than halogen lamps usually used for soldering. The lamp irradiation time was 10 seconds. FIGS. 10, 11, and 12 indicate open voltage, short-circuit current, and fill factor (F.F.), respectively.

As appreciated from FIGS. 10 and 12, the performance of the lamp irradiation outstandingly influences the open voltage and fill factor.

FIG. 11 shows the short-circuit currents of both cells heated by the heater alone and heated by the heater and lamp slightly deteriorate with an increase in temperature. This may be caused by the following reason. In the solar cell having a heterojunction made by combining amorphous silicon and crystalline silicon, surface electrodes (ex. ITO films) are formed at low temperatures (lower than 150 degrees Celsius) by a sputtering method or the like for the purpose of reducing thermal damage to the amorphous layer. It is known that such a formation at the low temperatures of 150 degrees Celsius to 200 degrees Celsius crystallizes the ITO films. The crystallization is accelerated by the application of heat of 150 degrees Celsius or higher, however, the ITO films are amorphous at temperature under 150 degrees Celsius. With the crystallization, the diffraction of the ITO films changes, therefore the short-circuit current characteristics tend to slightly deteriorate in comparison with the initial characteristics.

As described in the embodiment, the ITO films are crystallized when heated at 300 degrees Celsius even for a relatively short time, and show their diffraction change. This tendency becomes strong when the temperature exceeds 350 degrees Celsius, resulting in significant short-circuit current degradation. Thus, the heat treatment should be finished in a short time to prevent the degradation; however such a short-time heat treatment (shorter than 10 seconds) increases variations, which is difficult to control. Accordingly, the preferable temperature of the heater is 300 degrees Celsius or lower.

Some transparent electrodes except for the ITO film are crystallized at relatively high temperatures, yet still an improved usable output of the solar cell cannot be expected because the temperature of 350 degrees Celsius or higher causes the dopant and the like in the amorphous layer to move even in the short-time heat treatment of shorter than 10 seconds, which results in degradation of the open voltage. Accordingly, the preferable temperature of the heater is 350 degrees Celsius or lower even if other transparent electrodes are used in the solar cell.

Incidentally, the light in use for the irradiation is preferably visible light, infrared light or visible light and light (infrared light) having a longer wavelength than visible light, that is to say light in these wavelength bands is preferable. The halogen lamp used to irradiate light may be replaced with a xenon lamp, infrared lamp or the like.

Figure 13:
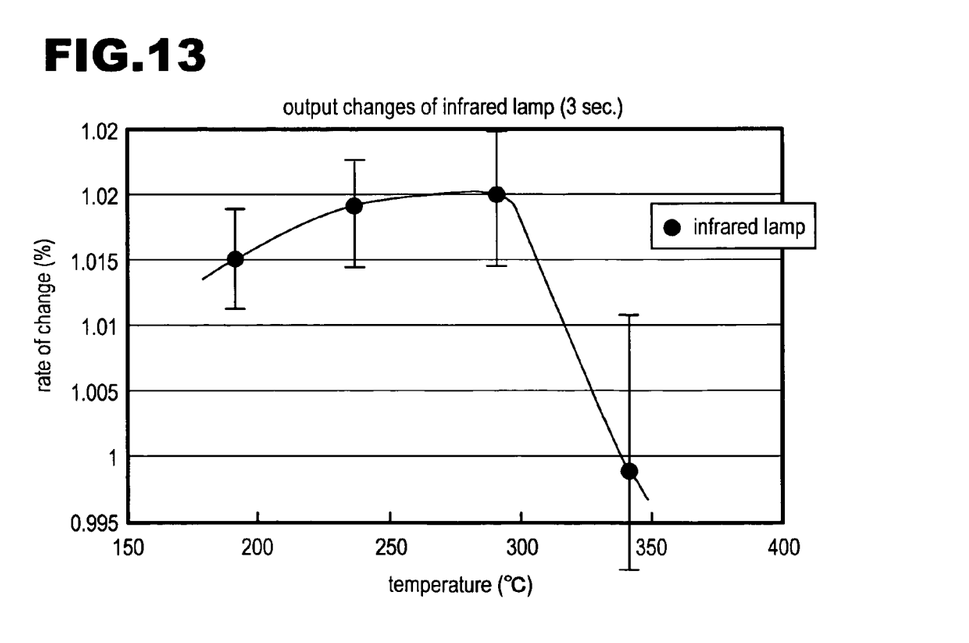
FIG. 13 illustrates the relationship between heating temperatures and changes in the characteristics when the cells are heated by the hot plate at from 290 degrees Celsius to 340 degrees Celsius and further irradiated with light by an infrared lamp.

Next, a high-power infrared lamp was used to irradiate light for a short time. The infrared lamp has a power of 2.5 kW. Although the effect of the infrared lamp greatly fluctuates, the characteristics improvement could be recognized as in the case of the halogen lamp. Five samples per a condition were prepared. FIG. 13 shows heating temperatures and characteristics of solar cells heated by the heater and lamp for 15 seconds (including lamp irradiation time). The characteristics are standardized by the characteristics of solar cells not having undergone the high-temperature heat treatment. Since the infrared lamp has a great irradiation intensity, the lamp irradiation was performed at 125 V for 3 seconds. From FIG. 13, it is recognized that the characteristics keep improving while the heating temperature is lower than 300 degrees Celsius, but plunge at the instant when the temperature reaches 350 degrees Celsius. In addition, an increase of applied voltage to 150 V and 175 V deteriorates the characteristics due to excessive temperature rise of the solar cell. It is considered to be an effect caused by the temperature rise of the solar cell above the set temperature of the heater in a short period of time due to the light irradiation. Note that the temperature of the solar cell was surely raised with the heating temperature rise, but the temperature rise of the solar cell occurred in a short time and was impossible to be measured accurately.

In the effect obtained in the embodiment it is assumed that optimal values may vary depending on the lamp output and heater temperature. Examples will be given with the cells heated by the combined use of the lamp irradiation and heater. As shown in FIG. 9, the cells heated by the heater at as low as 290 degrees Celsius require a longer time of the lamp irradiation to obtain the optimal value. Even when the cells are all heated by the heater at 300 degrees Celsius, the cell irradiated with light by a lamp having an output power higher than 1000 W, for example 2000 W would have the optimal value in a few seconds. It is assumed that lamps with further high lamp intensity (output) may provide the same effect without the heater. Thus, with regard to practical takt time (longer than 0 second to 60 seconds or shorter), the effective range may be: heater temperature being below 400 degrees Celsius or no heater; lamp output being 500 W to 3000 W; and irradiation time being within 60 seconds. Because the cells heated by a heater alone are affected by heating temperature and heating time, the optimal heating temperature may be 200 degrees Celsius to 350 degrees Celsius, and the optimal heating time may be within 60 seconds.

In the above-discussed embodiment, the lamp irradiation was performed so that light manufactured by Nichiyu Giken Kogyo Co., Ltd is applied on the surface of the solar cell. The temperature can be measured by observing the way the thermocrayon melts.

As a result of the two measurements, both methods indicated the solar cell temperature of 290 degrees Celsius or higher but lower than 300 degrees Celsius irrespective of the lamp irradiation.

Table 2 and FIG. 8 show maximum values, minimum values and average values of measurement results of five samples under each condition. The temperature of the heater was so controlled not to rise beyond an upper limit which was the measurement temperature (i.e. heating temperature in Table 2) set in each condition. Because of this, each sample was applied with somewhat lower heat than the measurement temperature; however it is still within the acceptable range.

TABLE 2

| heating temperature | without lamp irradiation | | | with lamp irradiation | | |
|---|---|---|---|---|---|---|
| (° C.) | max. | min. | ave. | max. | min. | ave. |
| 190 | 100.1 | 99.9 | 100 | 100.2 | 99.9 | 100 |
| 200 | 100.1 | 99.9 | 100 | — | — | — |
| 220 | 100.6 | 100.1 | 100.3 | — | — | — |
| 240 | 101.4 | 100.6 | 101 | 102.3 | 101.4 | 101.85 |
| 250 | 101.4 | 100.8 | 101 | — | — | — |
| 290 | 101.9 | 101.1 | 101.5 | 102.8 | 102 | 102.4 |
| 300 | 101.3 | 100.5 | 100.85 | — | — | — |
| 340 | 101.5 | 100.3 | 101 | 102.7 | 101.8 | 102.2 |
| 350 | 100.9 | 100 | 100.45 | — | — | — |

As appreciated from Table 2 and FIG. 8, it is found that the ten-second heat treatment by the hot plate apparently improves the characteristics of the cells heated at 200 degrees Celsius or from the lamp enters the light incident surface of the solar cell. However, in the case of a both-side power generation type solar cell having the identically configured collector electrode on the front and back surfaces thereof as shown in FIG. 1, it has been verified that lamp irradiation from the surface opposite to the light incident surface can provide the same effect. Additionally, in the case of the both-side power generation solar cell even having the differently configured collector electrode on the front and back surfaces, the same effect can be provided.

Further it is not necessary to equate the length of heating time of the lamp and heater. With a solar cell heated by the heater, the lamp irradiation may be performed for a shorter time than the heater. In this manner the solar cell can improve its output.

Although the combination of the hot plate and lamp was employed to heat the solar cell in the above-discussed embodiment, the single use of either the heater such as the hot plate or lamp may be acceptable, if each of them can generate high temperatures in a short time. Further, there may be another method in which stacked cells are placed in a high-temperature furnace (approximately 300 degrees Celsius) for a few seconds. In this case, light irradiation by a lamp is desirable because the lamp irradiation has an optimal value in heating temperature and heating time and causes less thermal damage. Since the lamp irradiation generates heat in a short time, the takt time of devices is not easily influenced by the heating conditions, and therefore the heat treatment can be performed under the optimal conditions that the cell characteristics can be improved. By the way, the simultaneous use of the lamp for improving the cell characteristics and for performing the soldering process of the connecting tabs could not obtain the improved characteristics, because it was necessary to increase temperature of the entire cell to melt solder, causing an excess amount of heat on the solar cell. In addition, warpage, crack and so forth generated during the process reduce yield.

Although the cells are subjected to the high-temperature heat treatment after application of flux in the above embodiment, some types of flux may be preferable to be applied after the application of high heat.

Although a description was made on a solar cell having a semiconductor heterojunction made by combining amorphous silicon and crystalline silicon in the above embodiment, the present invention is applicable to other solar cells having different structures. In the case where a polycrystalline silicon solar cell made of polycrystalline silicon and having a pn junction includes silicon nitride (SiN) as an antireflective film, it is known that interface properties are improved by passivating the interface with hydrogen. Since the antireflective film is formed through a thermal process using high temperatures (to form the pn junction), the heating process of the present invention holds a promise of allowing hydrogen in the antireflective film to improve grain boundary in the polycrystal, thereby improving the solar cell characteristics.

In the case where a thin film solar cell, which has multiple interfaces, including amorphous silicon, microcrystal silicon is used as a solar cell, improvement of the interface properties of the multiple interfaces can be expected with the high-temperature heat treatment process of the present invention, thereby enhancing the solar cell characteristics.

The present invention is applicable to a photovoltaic power generation system such as a residential photovoltaic system.

It should be understood that the embodiments disclosed herein are to be taken as examples and not limited. The scope of the present invention is defined not by the above described embodiments but by the following claims. All changes that fall within meets and bounds of the claims, or equivalence of such meets and bounds are intended to embraced by the claims.

What is claimed is:

1. A method for manufacturing a photovoltaic module including a plurality of solar cells each including a semiconductor heterojunction made by combining amorphous silicon and crystalline silicon and connecting members for connecting said plurality solar cells, said method comprising the steps of:
    connecting said connecting members to said solar cells by soldering after a high-temperature heat treatment is applied to the solar cells, and
    electrically connecting said plurality of solar cells to each other with said connecting members,
    wherein said high-temperature heat treatment comprises a ten-second heat treatment by a heater with a simultaneous light irradiation by a light irradiation device, while the temperature of a heater is at 200 degrees Celsius or higher but 350 degrees Celsius or lower.

2. The method for manufacturing the photovoltaic module according to claim 1, wherein
    said high-temperature heat treatment is performed after a collector electrode is formed on said solar cell.

3. The method for manufacturing the photovoltaic module according to claim 1, wherein
said soldering is performed by melting solder through application of hot air so that said connecting members are connected to said solar cells.

4. The method for manufacturing the photovoltaic module according to claim 1, wherein
said high-temperature heat treatment comprises application of heat by the heater with a simultaneous light irradiation by the light irradiation device, while the temperature of said heater is maintained at 290 degrees Celsius or higher but lower than 350 degrees Celsius, and the light irradiation by the light irradiation device is performed for from 2 seconds to 20 seconds.

5. The method for manufacturing the photovoltaic module according to claim 1, wherein
each said solar cell comprises transparent electrodes that are ITO films.

6. The method for manufacturing the photovoltaic module according to claim 1, wherein
said high-temperature heat treatment comprises application of heat by a heater with a simultaneous light irradiation by a halogen lamp device.

7. The method for manufacturing the photovoltaic module according to claim 1, wherein
said high-temperature heat treatment comprises application of heat by a heater with a simultaneous light irradiation by a halogen lamp device having an output of 1000 W or less.

8. The method for manufacturing the photovoltaic module according to claim 1, wherein
said high-temperature heat treatment comprises application of heat by a heater with a simultaneous light irradiation by a halogen lamp device, while the temperature of the heater is maintained at 200 degrees Celsius or higher but lower than 300 degrees Celsius, and the light irradiation by the halogen lamp device is performed for from 2 seconds to 20 seconds.

9. The method for manufacturing the photovoltaic module according to claim 1, wherein
said high-temperature heat treatment comprises application of heat by a heater with a simultaneous light irradiation by an infrared lamp device.

10. The method for manufacturing the photovoltaic module according to claim 1, wherein
said high-temperature heat treatment comprises application of heat by a heater a simultaneous light irradiation by an infrared light irradiation device, while the temperature of said heater is maintained at 200 degrees Celsius or higher but lower than 290 degrees Celsius, and the light irradiation by the infrared light irradiation device is performed for 3 seconds or shorter.

11. The method for manufacturing the photovoltaic module according to claim 1, wherein
said high-temperature heat treatment comprises application of heat by a heater with a simultaneous light irradiation by an infrared light irradiation device, while the temperature of said heater is maintained at 200 degrees Celsius or higher but lower than 290 degrees Celsius, and the light irradiation by the infrared light irradiation device is performed for 3 seconds or shorter, and
said infrared light irradiation device has an irradiation intensity of raising the temperature of said solar cell above the set temperature of the heater.

12. A method for manufacturing a photovoltaic module including a plurality of solar cells each including a semiconductor heterojunction made by combining amorphous silicon and crystalline silicon and connecting members for connecting said plurality solar cells, said method comprising the steps of:
connecting said connecting members to said solar cells by soldering after a high-temperature heat treatment is applied to the solar cells, and
electrically connecting said plurality of solar cells to each other with said connecting members,
wherein said high-temperature heat treatment comprises application of heat by a heater with a simultaneous light irradiation by a light irradiation device at 200 degrees Celsius or higher but 350 degrees Celsius or lower.

13. The method for manufacturing the photovoltaic module according to claim 12, wherein
each said solar cell comprises transparent electrodes that are ITO films.

14. The method for manufacturing the photovoltaic module according to claim 12, wherein
said high-temperature heat treatment comprises application of heat by the heater with a simultaneous light irradiation by the light irradiation device, while the temperature of said heater is maintained at 290 degrees Celsius or higher but lower than 350 degrees Celsius, and the light irradiation by the light irradiation device is performed for from 2 seconds to 20 seconds.

15. The method for manufacturing the photovoltaic module according to claim 12, wherein
said high-temperature heat treatment comprises application of heat by the heater with a simultaneous light irradiation by the light irradiation device for a predetermined period of time, while the temperature of the heater is maintained at 200 degrees Celsius or higher, thereby improving a solar cell output.

16. The method for manufacturing the photovoltaic module according to claim 12, wherein
said high-temperature heat treatment comprises application of heat by the heater with a simultaneous light irradiation by the light irradiation device for a predetermined period of time, while the temperature of the heater is maintained at 200 degrees Celsius or higher but 350 degrees Celsius or lower, thereby improving a solar cell output.

17. The method for manufacturing the photovoltaic module according to claim 12, wherein
said high-temperature heat treatment comprises application of heat by the heater with a simultaneous light irradiation by the light irradiation device which comprises a halogen lamp device.

18. The method for manufacturing the photovoltaic module according to claim 12, wherein
said high-temperature heat treatment comprises application of heat by the heater with a simultaneous light irradiation by the light irradiation device which comprises a halogen lamp device having an output of 1000 W or less.

19. The method for manufacturing the photovoltaic module according to claim 12, wherein
said high-temperature heat treatment comprises application of heat by the heater with a simultaneous light irradiation by the light irradiation device which comprises a halogen lamp device, while the temperature of the heater is maintained at 200 degrees Celsius or higher but lower than 300 degrees Celsius, and the light irradiation by the halogen lamp device is performed for from 2 seconds to 20 seconds.

20. The method for manufacturing the photovoltaic module according to claim 12, wherein said high-temperature heat treatment comprises application of heat by the heater with a simultaneous light irradiation by the light irradiation device which comprises an infrared lamp device.

21. The method for manufacturing the photovoltaic module according to claim 12, wherein
said high-temperature heat treatment comprises application of heat by the heater with a simultaneous light irradiation by the light irradiation device which comprises an infrared light irradiation device, while the temperature of said heater is maintained at 200 degrees Celsius or higher but lower than 290 degrees Celsius, and the light irradiation by the infrared light irradiation device is performed for 3 seconds or shorter.

22. The method for manufacturing the photovoltaic module according to claim 12, wherein
said high-temperature heat treatment comprises application of heat by the heater with a simultaneous light irradiation by the light irradiation device which comprises an infrared light irradiation device, while the temperature of said heater is maintained at 200 degrees Celsius or higher but lower than 290 degrees Celsius, and the light irradiation by the infrared light irradiation device is performed for 3 seconds or shorter, and
said infrared light irradiation device has an irradiation intensity of raising the temperature of said solar cell above the set temperature of the heater.

* * * * *